(12) United States Patent
Brask et al.

(10) Patent No.: US 7,402,856 B2
(45) Date of Patent: Jul. 22, 2008

(54) NON-PLANAR MICROELECTRONIC DEVICE HAVING ISOLATION ELEMENT TO MITIGATE FRINGE EFFECTS AND METHOD TO FABRICATE SAME

(75) Inventors: Justin K. Brask, Portland, OR (US); Jack T. Kavalieros, Portland, OR (US); Brian S. Doyle, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 237 days.

(21) Appl. No.: 11/299,102

(22) Filed: Dec. 9, 2005

(65) Prior Publication Data
US 2007/0134878 A1    Jun. 14, 2007

(51) Int. Cl.
*H01L 29/94* (2006.01)
(52) U.S. Cl. .................. 257/288; 257/327; 257/347; 257/619; 257/E29.295
(58) Field of Classification Search .................. 257/288, 257/327, 347, 349, 619, E29.295
See application file for complete search history.

(56) References Cited

U.S. PATENT DOCUMENTS

| | | | |
|---|---|---|---|
| 5,804,848 | A | 9/1998 | Mukai |
| 5,844,278 | A | 12/1998 | Mizuno et al. |
| 5,899,710 | A | 5/1999 | Mukai |
| 6,018,176 | A | 1/2000 | Lim |
| 6,066,869 | A | 5/2000 | Noble et al. |
| 6,413,802 | B1 | 7/2002 | Hu et al. |
| 6,459,123 | B1 | 10/2002 | Enders et al. |
| 6,472,258 | B1 | 10/2002 | Adkisson et al. |
| 6,525,403 | B2 | 2/2003 | Inaba et al. |
| 6,562,665 | B1 | 5/2003 | Yu |
| 6,583,469 | B1 | 6/2003 | Fried et al. |
| 6,611,029 | B1 | 8/2003 | Ahmed et al. |
| 6,630,388 | B2 | 10/2003 | Sekigawa et al. |
| 6,642,090 | B1 | 11/2003 | Fried et al. |
| 6,657,259 | B2 | 12/2003 | Fried et al. |

(Continued)

OTHER PUBLICATIONS

Yang-Kyu Choi, et al., Sub-20nm CMOS FinFet Technologies, IEEE, 2001, pp. 19.1.1-19.1.4, IEDM 01, Department of Electrical Engineering and Computer Sciences, University of California, Berkeley, USA.

(Continued)

*Primary Examiner*—Matthew E Warren
(74) *Attorney, Agent, or Firm*—Scott M. Lane

(57) ABSTRACT

A non-planar microelectronic device, a method of fabricating the device, and a system including the device. The non-planar microelectronic device comprises: a substrate body including a substrate base and a fin, the fin defining a device portion at a top region thereof; a gate dielectric layer extending at a predetermined height on two laterally opposing sidewalls of the fin, the predetermined height corresponding to a height of the device portion; a device isolation layer on the substrate body and having a thickness up to a lower limit of the device portion; a gate electrode on the device isolation layer and further extending on the gate dielectric layer; an isolation element extending on the two laterally opposing sidewalls of the fin up to a lower limit of the gate dielectric layer, the isolation element being adapted to reduce any fringe capacitance between the gate electrode and regions of the fin extending below the device portion.

12 Claims, 9 Drawing Sheets

U.S. PATENT DOCUMENTS

| | | |
|---|---|---|
| 6,689,650 B2 | 2/2004 | Gambino et al. |
| 6,770,516 B2 | 8/2004 | Wu et al. |
| 6,787,402 B1 | 9/2004 | Yu |
| 6,794,718 B2 | 9/2004 | Nowak et al. |
| 6,798,000 B2 | 9/2004 | Luyken et al. |
| 6,800,910 B2 | 10/2004 | Lin et al. |
| 6,803,631 B2 | 10/2004 | Dakshina-Murthy et al. |
| 6,812,075 B2 | 11/2004 | Fried et al. |
| 6,815,277 B2 | 11/2004 | Fried et al. |
| 6,821,834 B2 | 11/2004 | Ando |
| 6,833,588 B2 | 12/2004 | Yu et al. |
| 6,835,614 B2 | 12/2004 | Hanafi et al. |
| 6,635,909 B2 | 2/2005 | Clark et al. |
| 6,849,884 B2 | 2/2005 | Clark et al. |
| 6,869,868 B2 | 3/2005 | Chiu et al. |
| 6,885,055 B2 | 4/2005 | Lee |
| 6,897,527 B2 | 5/2005 | Dakshina-Murthy et al. |
| 7,224,019 B2 * | 5/2007 | Hieda et al. .................. 257/315 |
| 2005/0173768 A1 * | 8/2005 | Lee et al. ..................... 257/401 |
| 2006/0270156 A1 * | 11/2006 | Kim et al. ................... 438/257 |

OTHER PUBLICATIONS

Jong-Tae Park, et al., Pi-Gate Soi Mosfet, IEEE Electron Device Letters, Aug. 2001, 405-406, vol. 22, University of California, Berkeley, USA.

* cited by examiner

NON-PLANAR MICROELECTRONIC DEVICE HAVING ISOLATION ELEMENT TO MITIGATE FRINGE EFFECTS AND METHOD TO FABRICATE SAME

FIELD

The present invention relates to the field of microelectronic integrated circuit manufacturing, and more particularly to non-planar microelectronic devices, such as non-planar transistors and/or non-planar memory devices and their methods of fabrication.

BACKGROUND

As microelectronic devices become highly integrated, problems associated with degradation characteristics may arise. Examples of these problems for a transistor may include short channel effects, Drain Induced Barrier Lowering, subthreshold swing, increased leakage current, as well as increased parasitic capacitance between the junction region and the substrate.

Non-planar transistors, that is, transistors where the channel is defined on surfaces of a three dimensional body, typically in the form of a fin (such as, for example, the fin in a FinFET transistor including either a double-gate, an independent gate, or a trigate transistor), have been proposed in order to address many of the above integration problems. However, the introduction of non-planar transistors has introduced its own particular problems, such as, for example, corner effects, the difficulty of fabricating fins with high aspect ratios, floating body effects related to a fin built on an SOI substrate, and self-heating for non-planar transistors built on an SOI substrate, to name just a few.

In addition to the above-mentioned problems sometimes associated with non-planar transistors, one particular issue concerns fringe effects associated with unwanted capacitance between the gate electrode and the fin in a non-planar transistor built on a bulk silicon substrate. In this respect, reference is made to FIG. 1, where a conventional trigate transistor 100 is depicted. As shown in FIGS. 1a and 1b, trigate device 100 includes a substrate body 102 including a fin 104 and a substrate base 106. A device isolation layer 105 is provided on the substrate base 106 of substrate body 102 in order to isolate portions of the substrate body from a gate electrode 110 extending over the fin 104 as shown. Fin 104 includes a device portion 108, which corresponds to the portion of fin 104 extending above dotted indicator line A-A Device portion 108 includes an upper surface 112, and side walls 114 and 116, which together contribute to provide the channel regions of trigate device 100. Surfaces 112, 114 and 116 are covered by gate dielectric layer 119, a function of which is to control a capacitance between gate electrode 110 and device portion 108 to thereby control charge flow in the channel region. Dotted indicator line A-A has been provided. on FIGS. 1a and 1b to mark an upper surface of device isolation layer 105 corresponding to a lower demarcation line for device portion 108.

As seen in FIGS. 1a and 1b, disadvantageously, the provision of device isolation layer 105 onto substrate body 102 by way of etching typically results in the formation of side recesses 118 on each side of fin 104 below device. portion 108 as shown. It is noted that FIG. 1b shows a partially cut-off version of the trigate transistor 100, that is, a version where the source and drain portions are not fully shown by virtue of the device portion as having been cut off at the source and drain portions to show the recesses 118. However, general regions of device portion 108 corresponding to the source and drain portions are indicated by arrows as the source and drain regions S and D, respectively. The recesses 118 typically result from an etch process to etch the material of isolation layer 104 to the level of line A-A. When the gate electrode 110 is provided over fin 104, in the presence of recesses 118, the material of the same typically disadvantageously fills recesses 118 forming unwanted recess. electrode portions 120 as shown. The recess electrode portions 120 extending along the sides of fin 104 along a length thereof disadvantageously generate unwanted capacitance with regions of fin 104 extending below the device portion 108. In the presence of such fringe capacitance, fringe effects are disadvantageously observed according to which control of charge flow within the channel region becomes compromised, thus negatively impacting an electrical performance of the device as a whole.

The prior art has failed to provide a simple and effective manner of controlling fringe effects brought about as a result of recess electrode portions in non-planar microelectronic devices built on bulk substrates.

BRIEF DESCRIPTION OF THE DRAWINGS

Embodiments of the invention are illustrated by way of example and not by way of limitation in the figures of the accompanying drawings, in which the like references indicate similar elements and in which:

FIG. 1b is a perspective, partial cross-sectional view of the prior art transistor of FIG. 1a;

FIG. 2b is a perspective, partial cross-sectional view of the transistor of FIG. 2a;

DETAILED DESCRIPTION

A non-planar microelectronic device having an isolation element to mitigate fringe effects, a method of making the device, and a system incorporating the device are disclosed herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment, however, it may. The terms "comprising", "having" and "including" are synonymous, unless the context dictates otherwise.

Figure 1A:
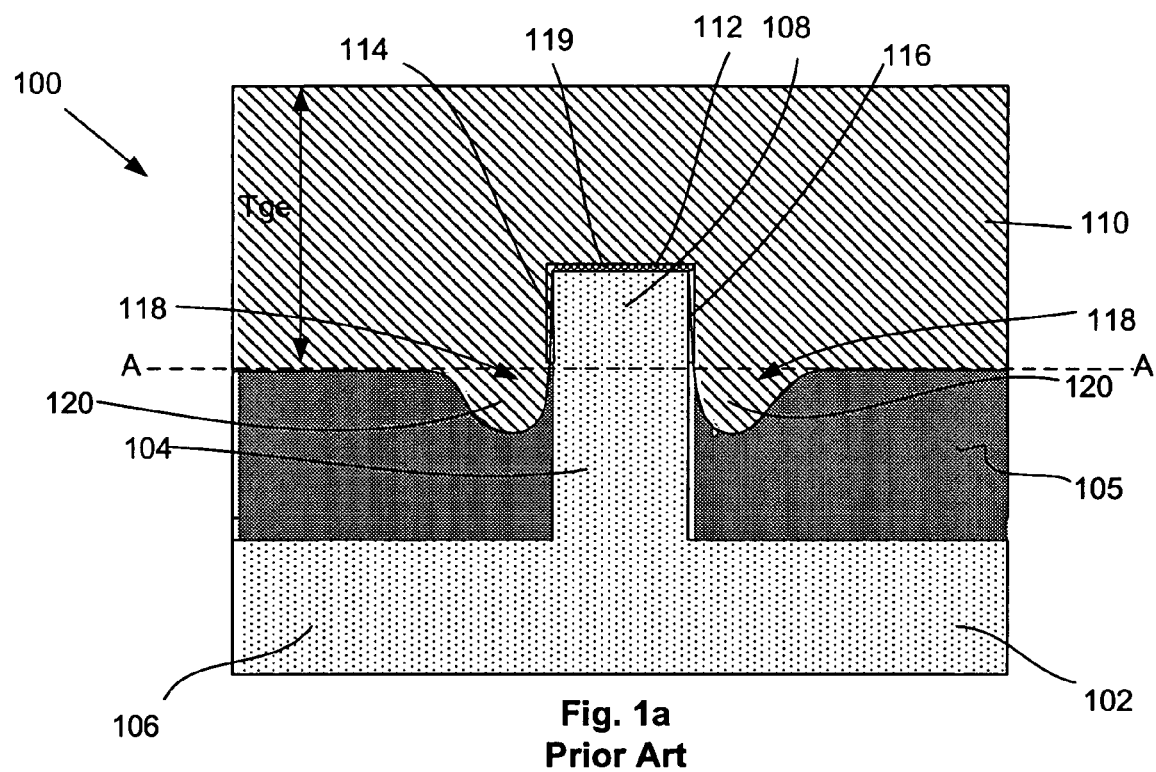
FIG. 1a is a widthwise cross-sectional view of a non-planar transistor according to the prior art.
Figure 1B:
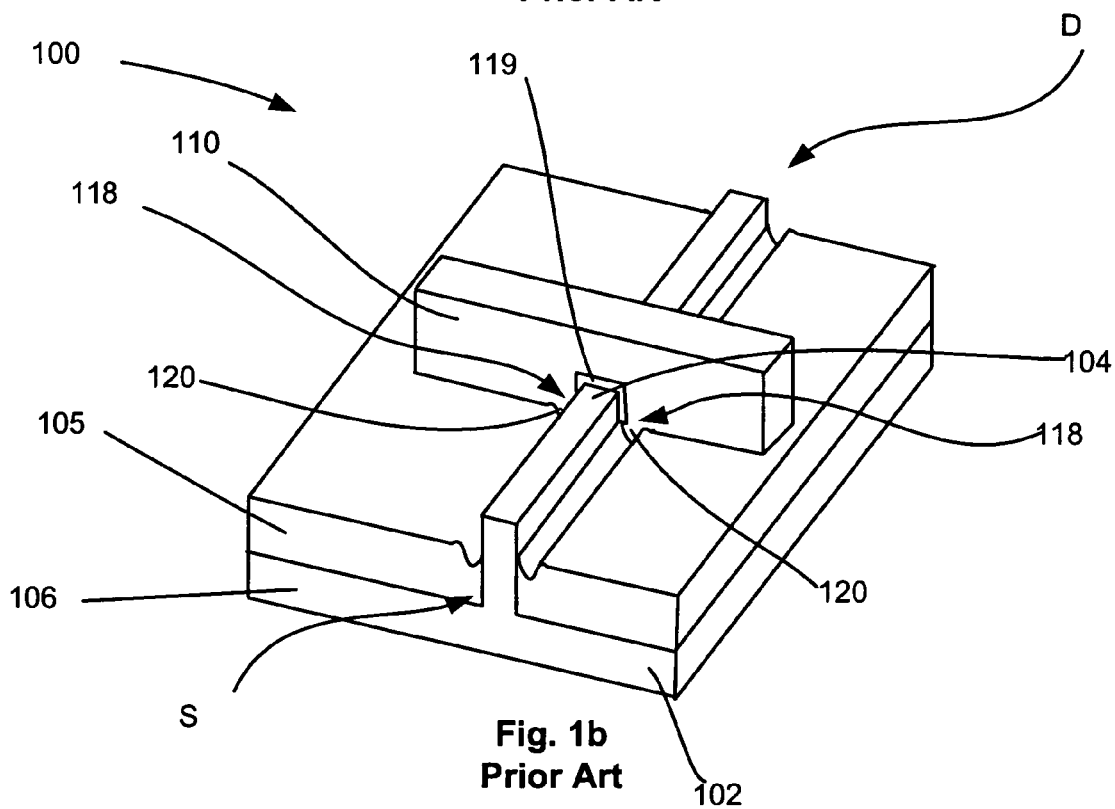
Figure 2A:
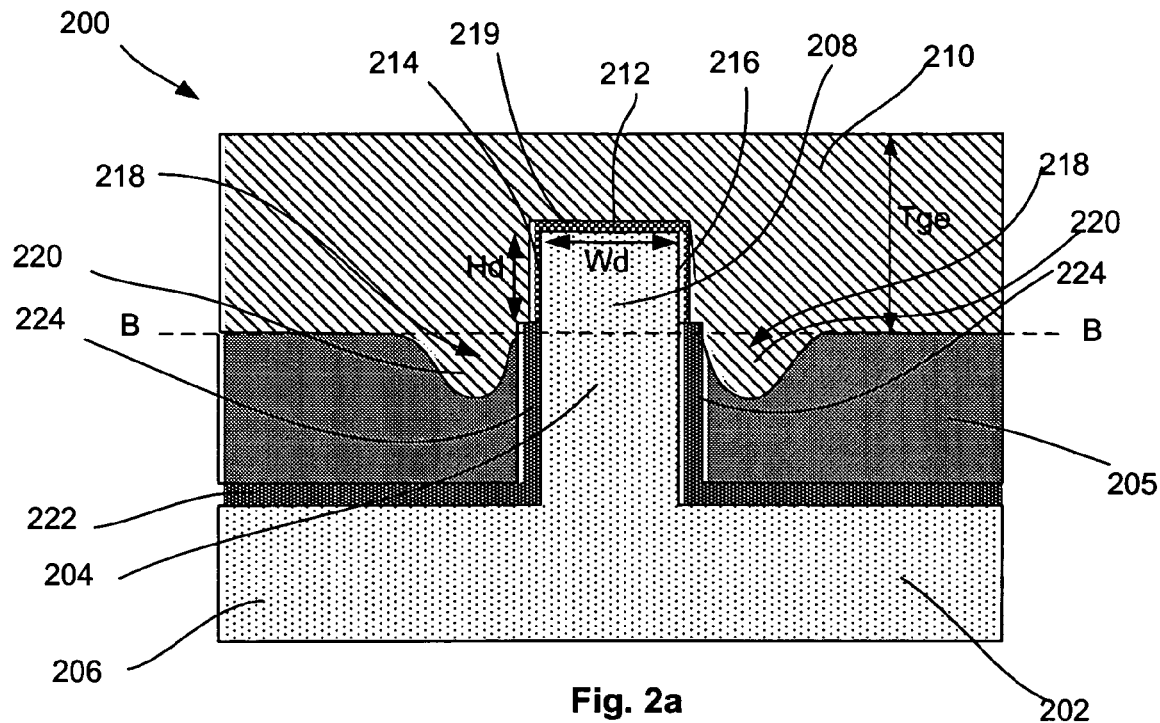
FIG. 2a is a view similar to FIG. 1 showing a non-planar transistor according to an embodiment.
Figure 2B:
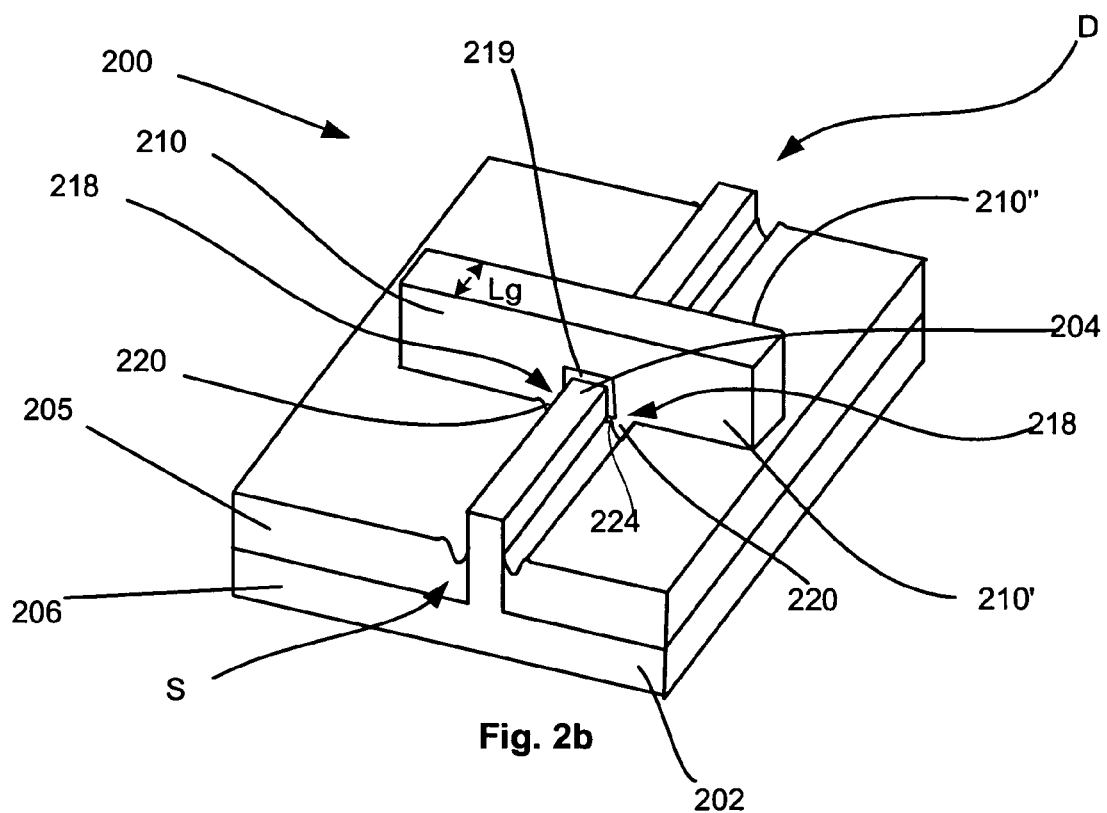

Referring next to FIGS. 2a and 2b by way of example, an embodiment of a non-planar transistor includes a trigate device, such as trigate device 200, which, similar to trigate device 100 of FIGS. 1a and 1b, comprises a substrate body 202 including a fin 204 and a substrate base 206. A device isolation layer 205, comprising, for example, silicon dioxide, or, in the alternative, nitrides, oxides, or other commonly used dielectrics, may be provided on the substrate base 206 of substrate body 202 in order to reduce a parasitic capacitance between a gate electrode 210 extending over the fin 204 and the substrate base 206 of substrate body 202. Fin 204 includes a device portion 208, which corresponds to the portion of fin 204 extending above dotted indicator line B-B. Device portion 208 includes an upper surface 212, and sidewalls 214 and 216, which together contribute to provide the channel regions of trigate device 200. Surfaces 212, 214 and 216 are covered by gate dielectric layer 219, a function of which is to control a capacitance between gate electrode 210 and device portion 208 to thereby control charge flow in the channel region. As seen in FIG. 2b, gate electrode 210 has a pair of laterally opposing sidewalls 210' and 210" separated by a distance Lg which defines the gate length of trigate transistor 200. Dotted indicator line B-B has been provided on FIG. 2a to mark an upper surface of device isolation layer 205 corresponding to a lower demarcation line for device portion 208. Sidewalls 214 and 216 of device portion 208 are separated by a distance which defines a width Wd of the device portion 208. In embodiments where the sidewalls do not extend parallel to one another (not shown), the width Wd would be correspond to the distance between the two sidewalls of the device portion at a top surface of the same. Additionally, a distance between top surface 212 of device portion 208 and the line of demarcation B-B defines a height Hd of the device portion 208. In an embodiment of the present invention, the height Hd is larger than width Wd as shown, although embodiments comprise within their scope the provision of a device having a Hd which is either smaller than or substantially equal to Wd. Preferably, Hd is about 0.5 times to about 3 times Wd. In an embodiment of the present invention, the device portion 208 has a Wd less than about 30 nanometers and ideally less than about 20 nanometers, and a height Hd of about 40 nanometers, and ideally less than about 60 nanometers. The gate width Gw of trigate transistor 200 is the sum of the widths of the three channel regions. That is, the gate width Gw is equal to the height Hd of device portion 208, plus the width Wd of device portion 208 at the top surface thereof, plus the height Hd of the device portion 208. A larger gate width could be obtained by stacking a plurality of device portions together, that is, by providing multiple device portions surrounded by a single gate electrode, as will be explained further below in relation to FIGS. 7a and 7b.

As further seen in FIGS. 2a and 2b, similar to the trigate device 100 of FIGS. 1a and 1b, the provision of isolation layer 205 by way of etching onto substrate body 202 may result in the formation of side recesses 218 on each side of fin 204 below device portion 208 as shown. It is noted that, similar to FIG. 1b, FIG. 2b shows a partially cut-off version of the trigate transistor 200, that is, a version where the source and drain portions are not fully shown by virtue of the device portion as having been cut off at the source and drain portions to show the recesses 218. However, general regions of device portion 208 corresponding to the source and drain portions are indicated by arrows as the source and drain regions S and D, respectively. Similar to recesses 118 of FIGS. 1a and 1b, the recesses 218 result from an etch process to etch the material of isolation layer 205 to the level of line B-B in order to expose the desired height Hd. However, contrary to trigate device 100, trigate device 200 according to an embodiment includes an isolation element 222 in the form of an isolation layer 224 provided to reduce any fringe capacitance between recess electrode portions 220 of the gate electrode 210 and regions of the fin 204 extending below device portion 208. By "fringe capacitance," what is meant in the context of the present invention is a capacitance between the gate electrode and portions of the fin not corresponding to the device portion, that is, portions of the fin extending below a lower limit of the device portion, such as, for example, below line B-B of FIG. 2a. Preferably, the isolation element 222 is configured to reduce fringe capacitance by between about 10% and about 40% depending on the material used for the isolation element. In particular, the lower the k value of the material thus used, the higher the reduction amount or reduction in fringe capacitance. The reduction of fringe capacitance as noted above is a function among other things of the geometry of the gate electrode. The fringe capacitance may be obtained by a ratio of permittivity over dielectric thickness, permittivity corresponding to a k value of a dielectric between the gate electrode and the fin, and thickness corresponding to the thickness of the dielectric the permittivity of which is being used in the ratio. Thus, providing an isolation element such as isolation element 222 advantageously at least increases the thickness of the dielectric in a region of recesses such as recessed 218, in this way reducing fringe capacitance. A reduction of such fringe capacitance brought about by the isolation element 222 advantageously substantially mitigates fringe effects according to which control of charge flow within the channel region would have become compromised, the isolation element in this manner improving an electrical performance of trigate device 200. In the shown embodiment of FIGS. 2a and 2b, the isolation element 222 as previously noted is in the form of an isolation layer 224 extending below device portion 208 along a length of fin 204, and on a surface of substrate base 206 in regions below the gate electrode as best shown in FIG. 2b. It is noted that, although FIG. 2b shows the isolation element 222 as being limited to regions below the gate electrode, embodiments include within their scope the provision of an isolation element that extends to regions beyond those below the gate electrode and even to regions throughout the isolation area.

Referring next to FIGS. 3a-8 by way of example, stages in the fabrication of a non-planar microelectronic device, such as trigate transistor 200 of FIGS. 2a and 2b, are depicted according to an embodiment. The stages shown in FIGS. 3a-8 will be described seriatim below.

A first stage of fabricating a non-planar transistor according to an embodiment comprises providing a substrate having a substrate base and a fin extending from the substrate base. Thus, referring to FIG. 3b by way of example, an embodiment comprises providing a substrate 202 having a substrate base 206 and a fin 204 as shown. To provide the fin, any well known method may be used, such as well known etching and photolithography techniques, or such as well known methods of implementing an epitaxial growth of a fin on a substrate, such as epitaxy using trenches. For example, well known semiconductor etching techniques, such as anisotropic plasma etching or reactive ion etching may be used to etch a fin from a substrate block. According to a preferred embodiment, the substrate comprises a bulk monocrystalline substrate. More preferably, the substrate comprises a bulk monocrystalline silicon substrate. However, according to embodiments, the substrate may comprise any other well-known semiconductor material, such as, for example, Ge, $Si_xGe_y$, GaAs, lnSb, GaP and GaSb.

Figure 3A:
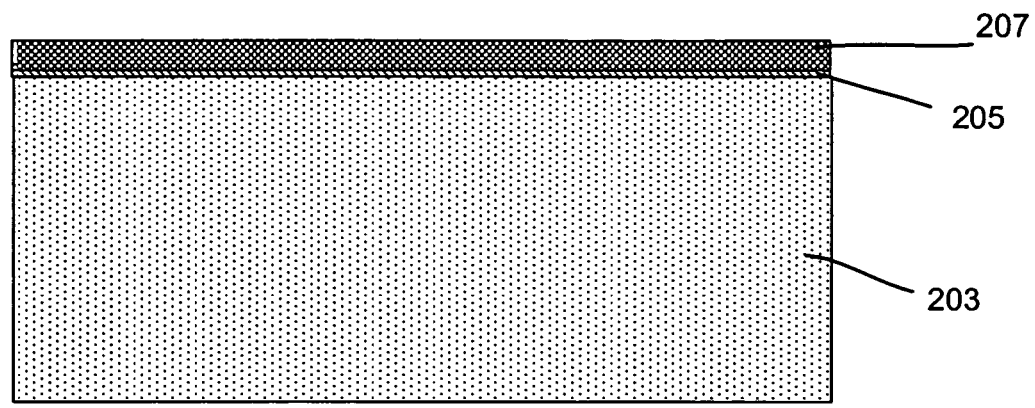
FIGS. 3a and 3b show a cross-sectional view of a substrate during formation of a fin from the substrate in a first stage of formation of the non-planar transistor of FIGS. 2a and 2b.
Figure 3B:
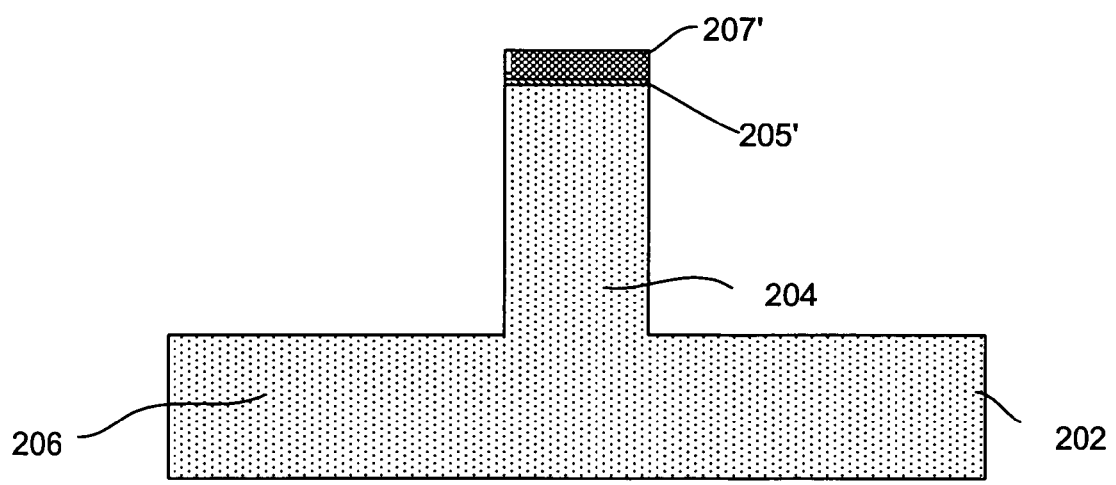

Referring in particular to FIGS. 3a and 3b, a method of providing the fin according to an embodiment involves using etching and lithography. Thus, as seen by way of example in FIG. 3a, according to an embodiment, a substrate block 203 may be provided, including an initial PAD oxide layer 205 and an initial nitride layer 207 thereon. The initial PAD oxide layer 205 and initial nitride layer 207 may be provided according to any one of the techniques available to one skilled in the art. Thereafter, well known lithography and etching may be used to create the fin 204 as seen in FIG. 3b, the fin including a nitride layer 207' and a PAD oxide layer 205' thereon. Advantageously, according to an embodiment, the nitride layer 207' may be adapted to serve as a polish stop to a subsequent polishing, as will be described further below, of a device isolation material to be provided on each side of the fin.

Referring next to FIGS. 4a-4e by way of example, a next stage of fabricating a non-planar transistor according to embodiments comprises providing an isolation element extending from a base of the fin to a lower limit of a device portion on the fin, the isolation element being adapted to reduce a capacitance between a gate electrode to be provided over the fin and portions of the fin not corresponding to the device portion, that is, to reduce a fringe capacitance of the device. According to a preferred embodiment as shown for example in FIGS. 4a-4e, the isolation element is in the form of an isolation layer, such as isolation layer 224. However, embodiments of the present invention are not limited to an isolation element in the form of an isolation layer, but include within their scope the provision of an isolation element of any shape adapted to provide reduction of fringe capacitance as noted above.

Figure 4A:
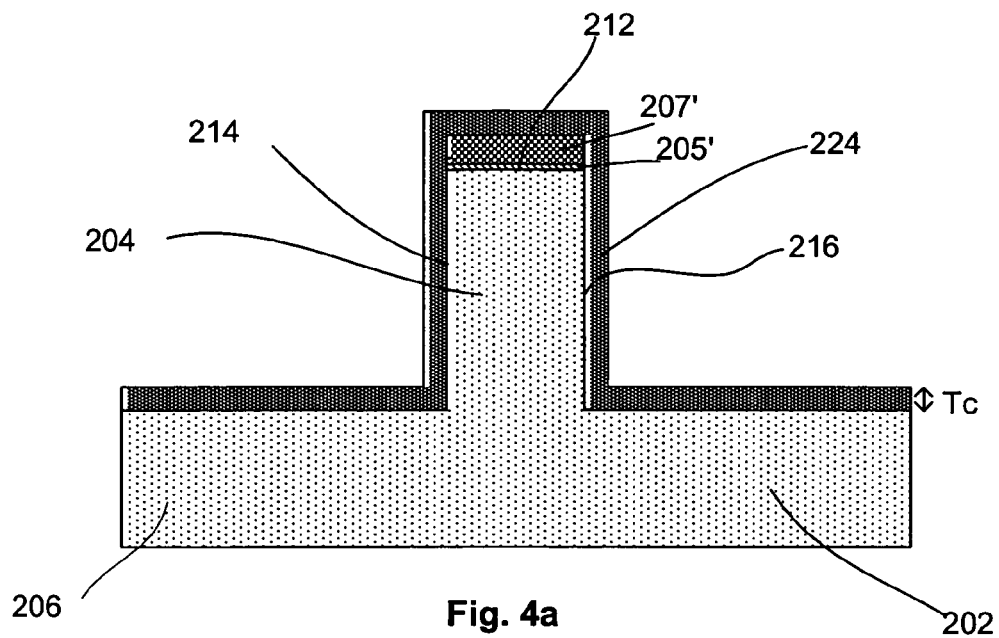
FIGS. 4a-4e are views similar to FIGS. 3a and 3b showing stages of formation of the isolation layer of the transistor of FIGS. 2a and 2b.

Referring first to FIG. 4a by way of example, a first stage of providing an isolation element in the form of an isolation layer according to an embodiment comprises providing a conformal isolation coating onto the fin. Thus, as seen in FIG. 4a, a conformal isolation coating 226 may be provided onto the side walls 214 and 216 of fin 204, and onto a top surface of the nitride layer 207' on the fin 204 as shown. The coating in the shown embodiment also encompasses a device-side surface of substrate base 206, although it is not necessary according to embodiments that the conformal isolation coating also encompass a device-side surface of substrate base 206. According to embodiments, where a conformal isolation coating is provided, the coating may comprise a material having etch characteristics that are different with respect to etch characteristics of the device isolation layer, such as, for example, device isolation layer 205 of FIG. 2a. In one embodiment, the coating may comprise a material that is adapted to serve as a polish stop to a subsequent polishing of the material of the device isolation layer. In a preferred embodiment, the conformal isolation coating comprises a nitride or a low K dielectric material, such as, for example, SiOF or carbon doped oxides. In a more preferred embodiment, the conformal isolation coating comprises a low K material having a K value that is lower than a K of a nitride. Where the isolation coating comprises a nitride, it may be provided according to any one of well known methods, such as, for example, CVD, PECVD, atomic layer epitaxy (or "ALD") and HDPECVD. Where the isolation coating comprises a low K dielectric material, it may be provided according to any one of well known methods, such as, for example, CVD, PECVD or ALD. A thickness Tc of conformal isolation coating, which may correspond to a thickness of a resultant isolation layer, such as layer 224 of FIG. 2b, may determined such that it substantially avoids a formation of voids during a subsequent filling of the regions about the fin with the material of the device isolation layer. Preferably, the isolation coating has a thickness Tc between about 3 nanometers and about 30 nanometers, and, more preferably, between about 5 nanometers and about 10 nanometers. In principle, a thickness Tc of the isolation coating may be empirically determined through an observation of an effect of different thicknesses of an isolation coating material on a reduction of unwanted capacitance. For example, a contribution of the fringe capacitance of total capacitance may first be determined by setting Wd and by shrinking Lg, and thereafter by plotting capacitance versus Lg as Lg shrinks. To the extent that, all else being equal except for a shrinking Lg, the fringe capacitance would be a constant value, the fringe capacitance contribution to total capacitance could in this way be determined. Thereafter, a reduction in the fringe capacitance as a function of isolation coating material thickness may in turn be empirically determined.

Figure 4B:
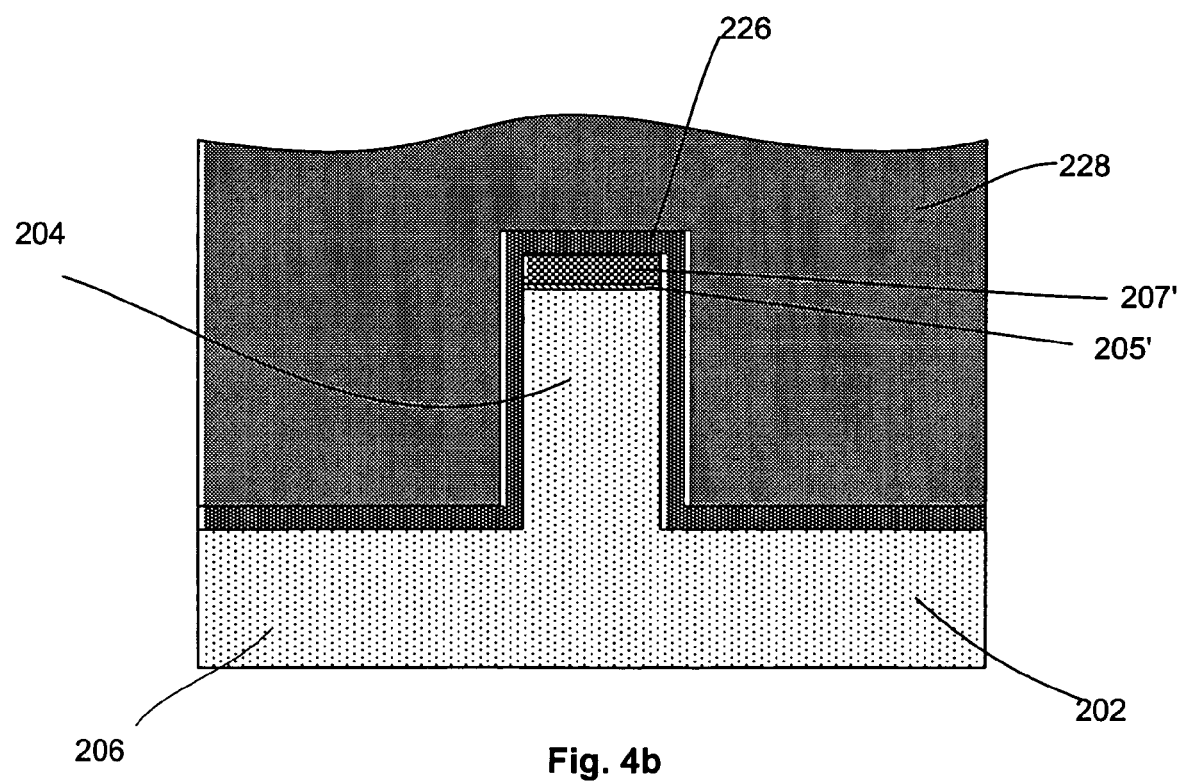

Referring next to FIG. 4b by way of example, a second stage of providing an isolation element in the form of an isolation layer according to an embodiment comprises providing a device isolation material encompassing the conformal isolation coating on the fin. By "encompassing," what is meant in the context of the present description is "fully including within its extent." Thus, as seen in FIG. 4b, a device isolation material 228 may be provided in one embodiment to encompass conformal isolation coating 226 as shown. It is noted, however, that it is not necessary according to embodiments that the device isolation material encompass the conformal isolation coating. Thus, embodiments include within their scope the provision of a device isolation material that only partially encompasses the conformal isolation coating (not shown). According to embodiments, the device isolation material may comprise a material having etch characteristics that are different with respect to etch characteristics of the material of the conformal isolation coating, and, in addition, a material that is adapted to be polished by a polishing process with respect to which at least one of the nitride layer and the material of the conformal isolation coating acts as a polish stop. In a preferred embodiment, the device isolation material comprises silicon dioxide, or, in the alternative, nitrides, oxides or other commonly used dielectrics. The device isolation material may be provided according to any one of well known methods, such as, for example, CVD, PECVD, ALD or HDPECVD.

Figure 4C:
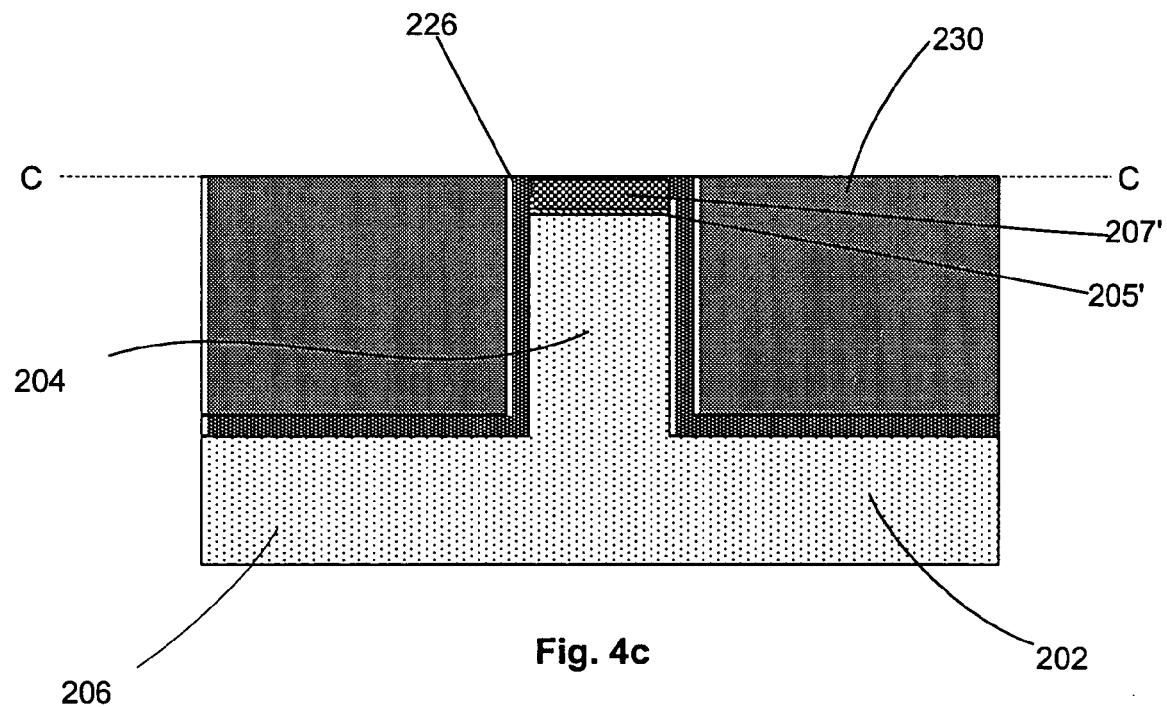

Referring next to FIG. 4c by way of example, a third stage of providing an isolation element in the form of an isolation layer according to an embodiment comprises polishing the device isolation material to a predetermined polish level. By "predetermined polish level," what is meant in the context of the present invention is a level substantially corresponding to one of an upper surface of the conformal isolation coating (that is, when the conformal isolation coating includes a material adapted to serve as a polish stop to a polishing. of the device isolation material) and an upper surface of the nitride layer (that is, when the top surface of the fin includes a nitride layer thereon, and when the conformal isolation coating cannot serve as a polish stop to a polishing of the device isolation material). Thus, as seen by way of example in FIG. 4c, the device isolation material 228 is shown as having been polished to a level C-C corresponding to an upper surface of nitride layer 207' on the fin 204, the upper surface of nitride layer 207' having served as a polish stop to the polishing of the device isolation material. Where a nitride layer is not used, or where the conformal isolating coating comprises a polish stop material, such as, for example, a nitride, the level C-C would correspond (not shown) to an upper surface of the conformal isolation coating. According to an embodiment, polishing may, as is well known, comprise chemical mechanical polishing, or any other well known polishing technique as would be recognized by one skilled in the art. Polishing according to an embodiment is effected because the upcoming stages in the process require a level surface of the device isolation material. Polishing according to an embodiment results in a polished device isolation material 230 as shown in FIG. 4c.

Figure 4D:
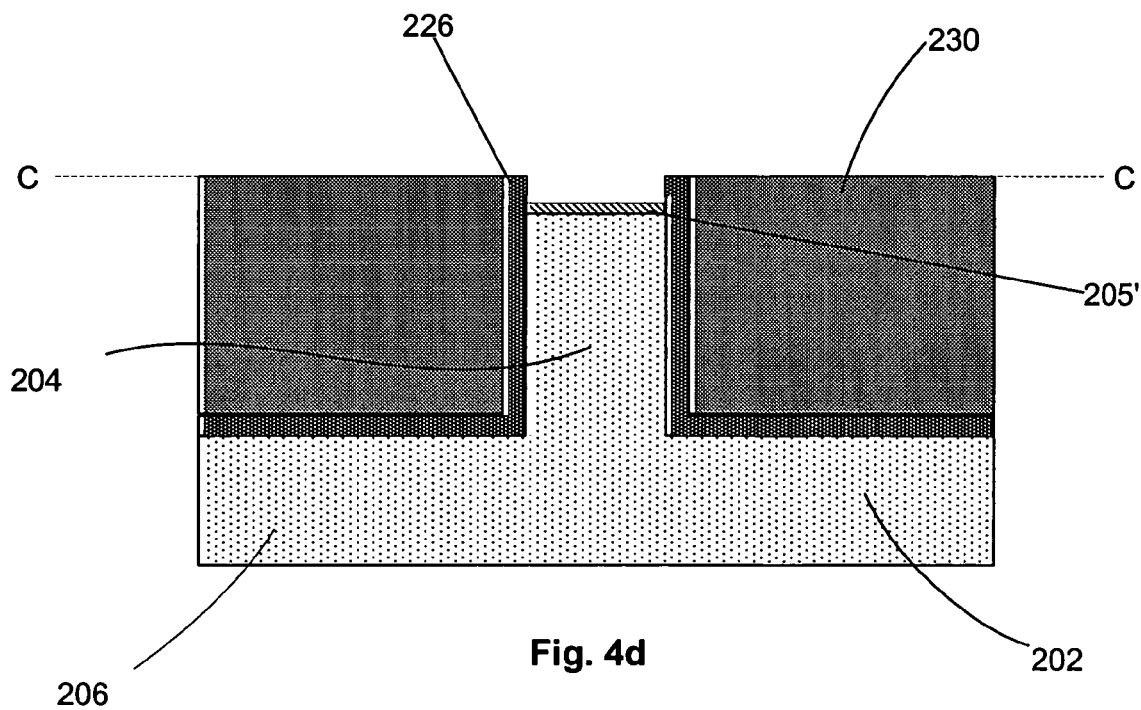

Referring next to FIG. 4d by way of example, an embodiment of the present invention comprises removing the nitride layer from the fin. Thus, as seen in FIG. 4d, nitride layer 207' may be removed from fin 204 according to any one of well known methods, such as, for example a wet etch or a dry etch. An example of a wet etch that may be used to remove the nitride layer may include a phosphoric etch.

Figure 4E:
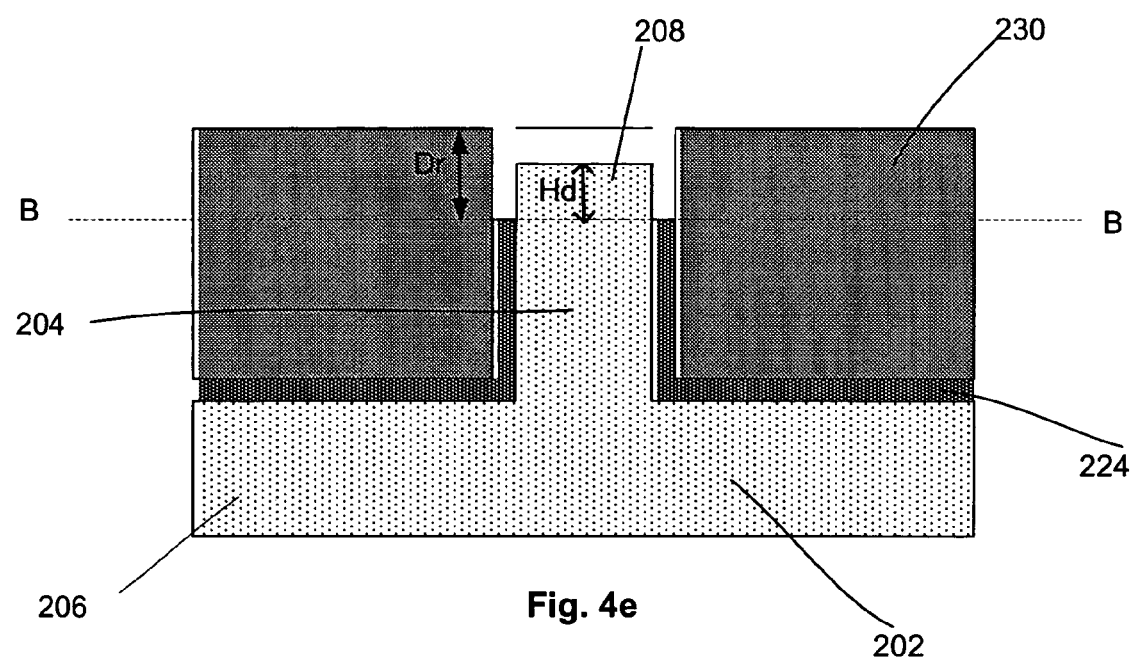

Referring now to FIG. 4e by way of example, a fourth stage of providing an isolation element in the form of an isolation layer according to an embodiment comprises etching the conformal isolation coating to a depth corresponding to a lower limit of a device portion of the fin. In the shown embodiment, an etching of the conformal isolation coating also brings about a concurrent removal of the PAD oxide layer 205' as shown. However, embodiments comprise within their scope a removal of a PAD oxide layer either during a removal of the nitride layer such as through etching, during an etching of the conformal isolation coating, or anytime thereafter, according to any of the techniques known to one skilled in the art. Thus, as seen in FIG. 4e by way of example, an embodiment comprises etching the conformal isolation coating 226 such to a depth Dr corresponding to a lower limit of device portion 208. According to one embodiment, etching of the conformal isolation coating may be effected using either a wet etch, such as, for example, a phosphoric etch, or an HF etch, or such as a dry etch, such as, for example, a $C_2F_6$, $CF_4$ or $CHF_3$ etch, and in either case an etch that is selective with respect to the material of the conformal isolation coating, as opposed to a selectivity with respect to the device isolation material. The thickness Tc is determined as noted below with respect to FIG. 4a. The width Wd and height Hd of the device portion 208 as best shown in particular in FIG. 2a are in turn a function of the effective gate length that would need to be supported by the device portion 208 of fin 204. In particular, according to an embodiment, a determination of subthreshold swing as a function of a ratio of effective gate length over effective device portion width would yield a desired optimum subthreshold swing value which, once the effective gate length is known, can in turn yield the value for Wd and Hd, as would be recognized by one skilled in the art. For example, in an embodiment, Hd, Wd and Lg are chosen to have dimensions in which a fully depleted transistor would be formed. For example, in another embodiment, Hd, Wd and Lg are chosen to have dimensions such that a partially depleted transistor is formed. Thus, as noted above, and as shown by way of example in FIG. 4e, the conformal isolation coating is etched down to a depth Dr which corresponds to a lower limit of the device portion 208 as shown to yield the isolation layer 224. In an embodiment, Hd is less than about 30 nanometers, and, preferably, less than about 20 nanometers. In another embodiment, Hd is approximately equal to Lg.

Figure 5:
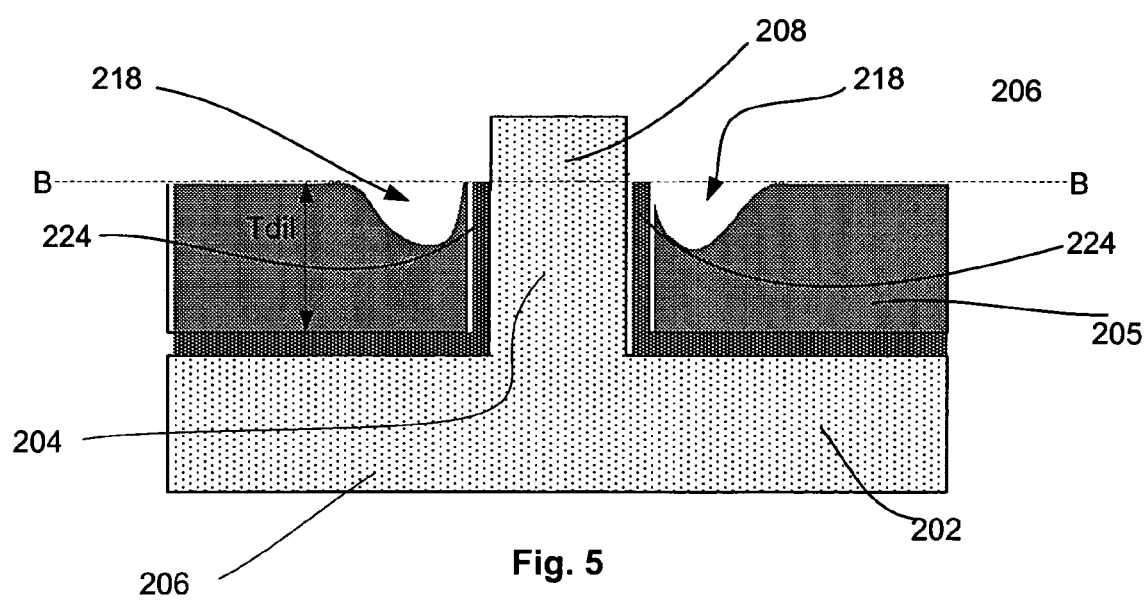
FIG. 5 is a view similar to FIG. 3 showing a formation of a device isolation layer of the transistor of FIGS. 2a and 2b.

Referring now to FIG. 5 by way of example, a next stage of fabricating a non-planar transistor according to embodiments comprises etching the polished device isolation material to yield the device isolation layer. Thus, in the shown embodiment, a wet etch, such as an HF etch, or a TriMix etch (i.e., an etch including $NH_4F$ and HF and $H_2O$) may be used in order to etch the polished device isolation material to yield the device isolation layer. The type of etch that may be used according to embodiments is selective to the device isolation material, and thus does not affect the material of the isolation layer. The etching may be performed to yield a thickness Tdil of the device isolation layer that is effective for achieving an isolation of the substrate base 206. from a parasitic capacitance of the gate electrode 210. For example, the device isolation layer may have a thickness between about 50 nanometers and about 400 nanometers, and, preferably between about 100 nanometers and about 200 nanometers. As seen in FIG. 5, etching of the device isolation material 228 to yield the device isolation layer 205 may result in the formation of side recesses 218 on each side of fin 204 below device portion 208 as shown. However, the provision of an isolation element in the form of an isolation layer 224 is effective to advantageously reduce any fringe capacitance between recess electrode portions 220 (see FIG. 2a) of gate electrdode 210 in the side recesses 218 and regions of the fin 204 extending below device portion 208.

Figure 6:
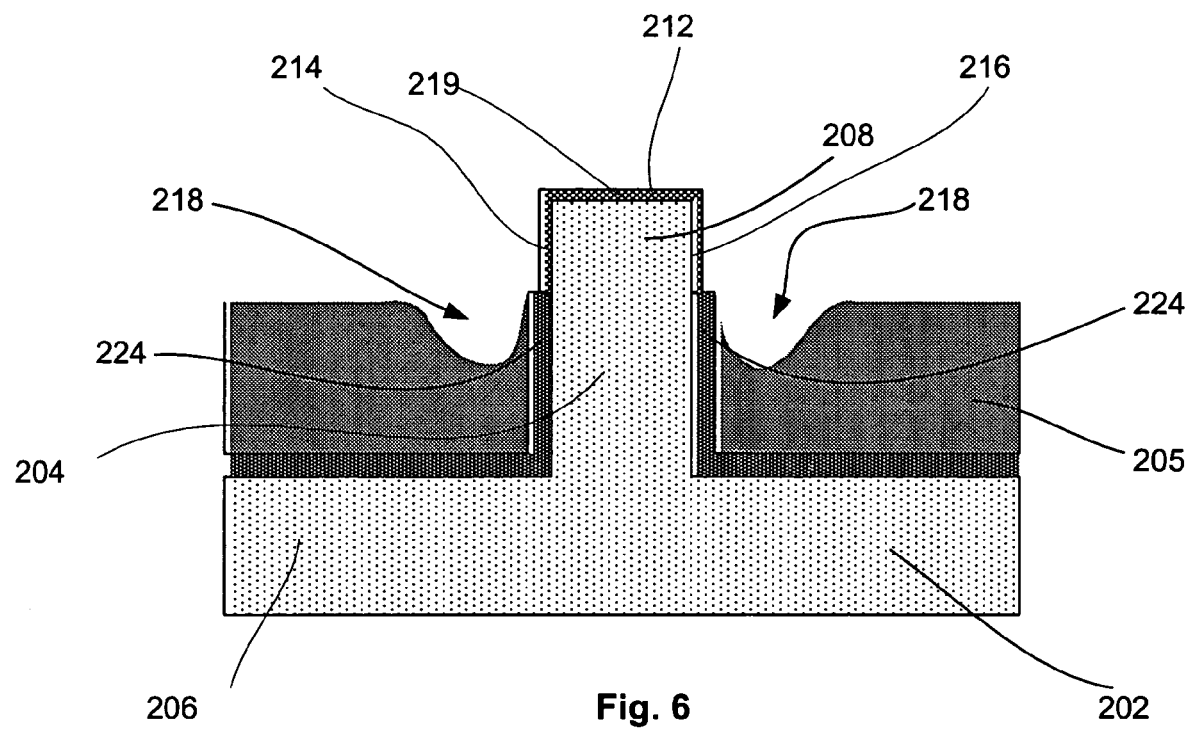
FIG. 6 is a view similar to FIG. 3 showing a formation of a gate dielectric layer of the transistor of FIGS. 2a and 2b.

As seen in FIG. 6 by way of example, a next stage of fabricating a non-planar transistor according to embodiments comprises providing a gate dielectric layer on the device portion of the fin. According to an embodiment, providing a gate dielectric layer comprises providing the gate dielectric layer on both side walls and on a top surface of the device portion to yield a trigate device. Thus, as seen by way of example in FIG. 6, a gate dielectric layer 219 is shown as having been provided on both side walls 214 and 216, and, in addition, on the top surface 218 of the device portion 208 in order for the device portion to function as a trigate device. It is noted, however, that embodiments are not limited to trigate devices, and include within their scope the provision of a gate dielectric on the device portion in a configuration to yield for example a double gate device (gate dielectric layer on side walls only). According to embodiments, the gate dielectric layer may be a deposited dielectric or a grown dielectric. In an embodiment, gate dielectric layer may include a silicon dioxide dielectric film grown with a dry/wet oxidation process. In an embodiment, the silicon oxide film may be grown to a thickness of between about 5 to about 15 Angstroms. According to another embodiment, the gate dielectric layer is a deposited dielectric, such as, for example, a high dielectric constant film, including a metal oxide dielectric, such as tantalum pentaoxide and titanium oxide or other high K dielectrics, such as $HfO_2$, $ZrO_2$, $Ta_2O_5$, $TiO_2$, PZT and BST. A high dielectric constant film can be formed by any well known technique, such as by CVD.

Referring now back to FIG. 2a, a next stage of fabricating a non-planar transistor according to embodiments comprises providing a gate electrode on the device portion of the fin. According to an embodiment, providing a gate electrode comprises providing the gate electrode on both side walls and on a top surface of the device portion to yield a trigate device. Thus, as seen by way of example in FIG. 2a, a gate electrode 210 is shown as having been provided adjacent both side walls 214 and 216, and, in addition, adjacent the top surface 212 of the device portion 208 in order for the device portion to function as a trigate device. However, embodiments include within their scope the provision of the gate electrode adjacent only the side walls 214 and 216 of the device portion 208 to yield for example an independent gate non-planar device, as would be within the knowledge of one skilled in the art. Gate electrode 210 can be formed by blanket depositing a suitable gate electrode material over the device portion. The gate electrode can be formed to a thickness Tge between about 200 and about 3000 Å. In an embodiment the gate electrode has a thickness Tge or height of about two to about three times the height Hd of device portion 208. The gate electrode material is then patterned with well-known photolithography and etching techniques to form gate electrode 210 from the gate electrode material. In embodiment of the present invention, the gate electrode material comprises polycrystalline silicon. In another embodiment of the present invention, the gate electrode material comprises a polycrystalline silicon germanium alloy. In yet other embodiment of the present invention, the gate electrode material can comprise a metal film, such as titanium, tungsten, tantalum, and their nitrides. In an embodiment of the present invention, the photolithography process used to define gate electrode 210 utilizes the minimum or smallest dimension lithography process used to fabricate the non-planar device. That is, in an embodiment of the present invention, the gate length Lg of gate electrode 210 has a minimum feature dimension of the transistor defined by photolithography. In an embodiment of the present invention, the gate length Lg is less than or equal to 30 nanometers and ideally less than or equal to 20 nanometers.

After formation of the gate electrode, source and drain regions S and D may be provided according to well known techniques, such as, for example, doping, the deposition of silicon on the source and drain regions and silicide formation, in order to provide a non-planar transistor according to embodiments. In addition, embodiments include within their scope additional processing such as through the provision of heavily doped source and drain regions and the provision of dielectric sidewall spacers on the sidewalls of the gate electrode, as would be within the knowledge of one skilled in the art.

It is noted that, although the process flow depicted in the figures pertains to the provision of the fin using etching and lithography, as noted above, embodiments comprise within their scope the use of any other method for providing the fin, such as, for example, epitaxy. In addition, although the process flow shown in the figures pertains to keeping the nitride layer, such as layer 207' on the fin during the application of the conformal isolation coating, embodiments comprise within their scope a provision of the conformal isolation coating on a fin which does not include a nitride layer thereon, a process flow pertaining to the latter being otherwise the same as that outlined in the figures. In a case where there is no nitride layer on the fin prior to deposition of the conformal isolation coating, according to an embodiment, the conformal isolation coating may be made of a material and made to have a thickness that would allow the conformal isolation coating to serve as a polish stop to a polishing of the device isolation material, such as the polishing depicted by way of example in FIG. 4c. In such a case, the conformal isolation coating may be made of a nitride. Moreover, where the fin is provided through epitaxy, embodiments contemplate the provision of the isolation element through methods other than the provision of a conformal isolation coating, such as, for example, through methods involving the provision of an isolation element in a trench (not shown) conventionally provided for the epitaxial growth of the fin therein.

Figure 7A:
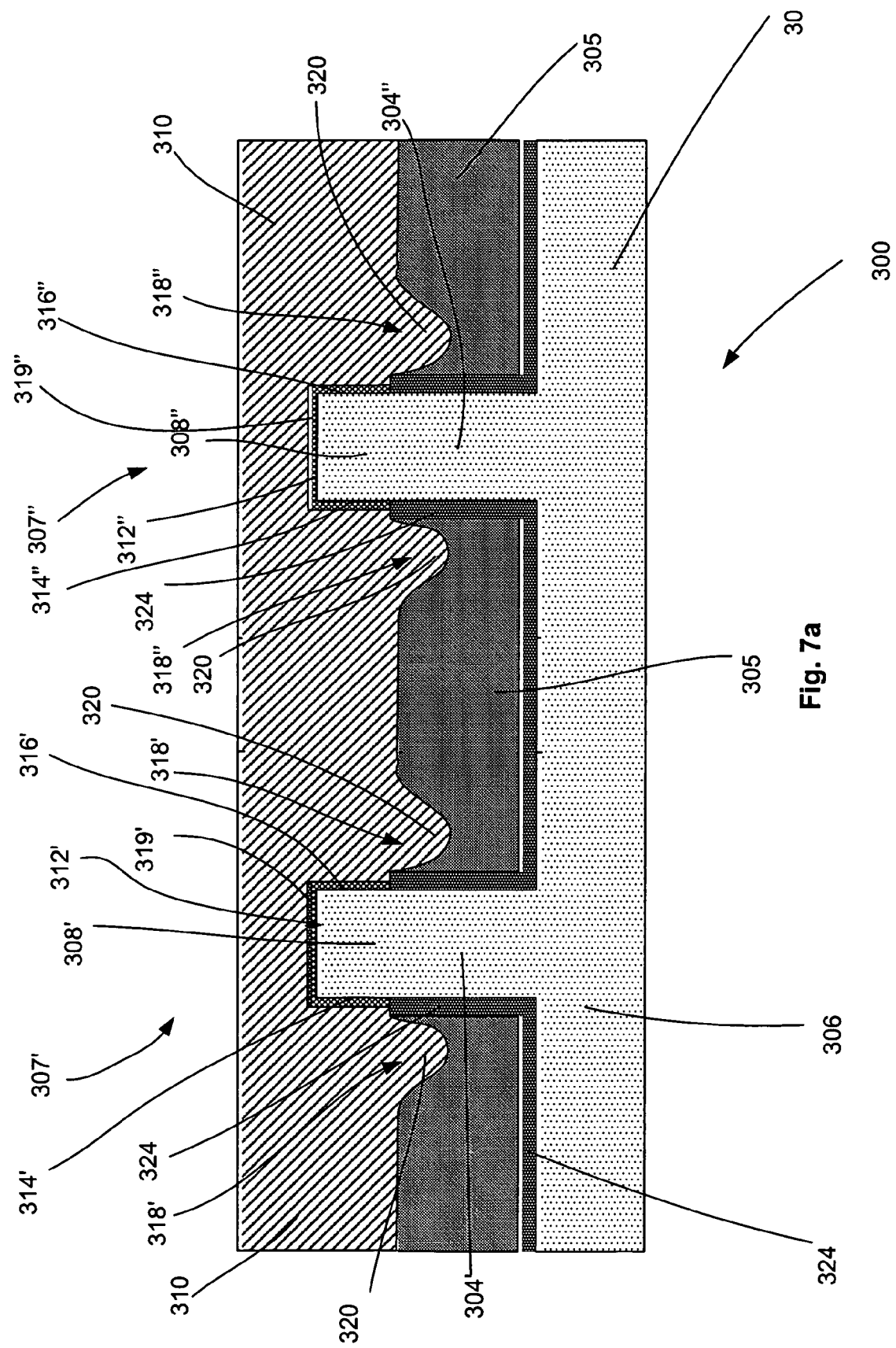
FIGS. 7a and 7b show two respective embodiments of stacked non-planar transistors.
Figure 7B:
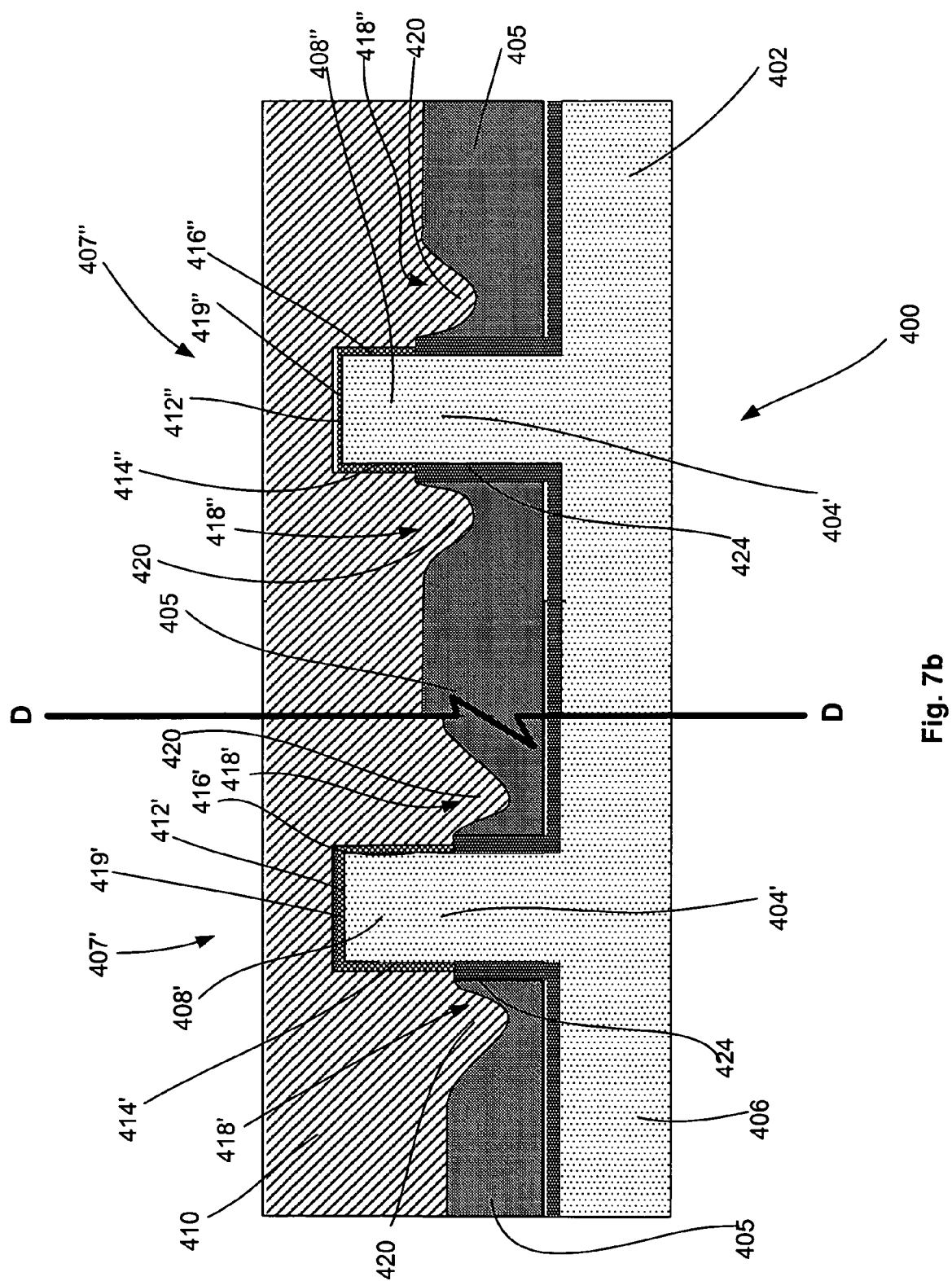

As noted previously, the gate width of transistor 200 is equal to the sum of the three dimensions of the device body, that is, the sum of Hd plus Wd plus Hd. In order to fabricate a transistor with large gate widths, a non-planar transistor may include a stacking of device portions similar to device portion 208 of transistor 200 shown in FIG. 2a (or by increasing the Hd). Referring in this context to FIGS. 7a and 7b, two respective stacked non-planar transistors 300 and 400 are shown. Transistors 300 and 400 in each case comprise a transistor configuration including two device portions both of which are controlled by a common gate electrode extending thereon. It is thus clear from FIGS. 7a and 7b that a stacking of multiple device portions under the same gate electrode increases the effective width of the transistor.

Referring in particular to transistor 300 of FIG. 7a, for example, a stacked transistor 300 is shown having two substantially identical device components 307' and 307". Device components 307' and 307" include, respectively, device portions 308' and 308" controlled by a common gate electrode 310 extending thereon. Device portions 308' and 308" include a substrate body 302 having two fins 304' and 304" and a substrate base 306. A device isolation layer 305 is further provided. Each of the projections parts 304' and 304" include respective side walls 314' and 314", and 316' and 316", and respective top surfaces 312' and 312" as shown. Surfaces 312', 314' and 316' on the one hand, and 312", 314" and 316" on the other hand are covered, respectively, by gate dielectric layers 319' and 319". As is clear from the configuration of transistor 300, the gate width Gw of the transistor is doubled as compared with a configuration where only one of the projections parts 304' or 304" would have been present, to the extent that the two device portions 308' and 308" are identical. Since the two shown device portions 308' and 308" exhibit the same heights Hd and the same widths Wd, they therefore yield a total device that has an effective width that is double that of a single device component as shown. As shown, isolation layer 324 reduces any fringe capacitance between recess electrode portions 320 of gate electrode 310 and regions of the fins 304' and 304" extending, respectively, below device portions 308' and 308".

Referring next to transistor 400 of FIG. 7b, for example, a stacked transistor 400 having two device components 407' and 407". A break line D-D in FIG. 7b is provided only to suggest that a transition between the two device components 407' and 407" is not fully shown in the figures. The device components 407' and 407" include, respectively, device portions 408' and 408" controlled by a common gate electrode 410 extending thereon. Device portions 408' and 408" include a substrate body 402 having two fins 404' and 404" and a substrate base 406. A device isolation layer 405 is further provided. Each of the projections parts 404' and 404" include respective side walls 414' and 414", and 416' and 416", and respective top surfaces 412' and 412" as shown. Surfaces 412', 414' and 416' on the one hand, and 412", 414" and 416" on the other hand are covered, respectively, by gate dielectric layers 419' and 419". As is clear from the configuration of transistor 400, the gate width Gw of the transistor is increased as compared with a configuration where only one of the projections parts 404' or 404" would have been present. In the shown embodiment, contrary to the configuration of FIG. 7a, the two device portions 408' and 408" exhibit different heights Hd and the same widths Wd. As shown, isolation layer 424 reduces any fringe capacitance between recess electrode portions 420 of gate electrode 410 and regions of the fins 404' and 404" extending, respectively, below device portions 408' and 408".

Transistors 300 and 400 may be fabricated in general according to the method embodiments described above with respect to transistor 200 of FIGS. 2a and 2b, as set forth in detail in relation to FIGS. 3-6. Where the individual device components exhibit different heights, as, for example, in the case of transistor 400 of FIG. 7b having device components 407' and 407" that are different from each other, each portion of the transistor corresponding to a given device component may be exposed to different etch processes while masking off the other portion of the transistor, as would be recognized by one skilled in the art. With respect to the stacking of device portions as shown by way of example in FIGS. 7a and 7b, it is not necessary that the device portions of each device component have the same widths. Thus, embodiments include within their scope the provision of stacked device portions having both heights and widths that are different from one another. Embodiments further include within their scope the provision of any number of device components in a stacked non-planar device having an isolation element.

Advantageously, embodiments of the present invention provide an isolation element that allows a mitigation of fringe effects from recess electrode portions typically seen in non-planar microelectronic devices built on bulk substrates, such as on bulk silicon substrates. Such mitigation advantageously allows substantial consistency with respect to the performance of such non-planar microelectronic devices as a result of body height variations, that is, as a result of variations in the effective height of the device portion on a fin of a non-planar transistor. It is noted in addition that, advantageously, embodiments are not limited to logic devices such as transistors, but include within their scope the provision of an isolation element such as an isolation layer on any non-planar microelectronic device, such as, for example, a non-planar flash memory device.

Figure 8:
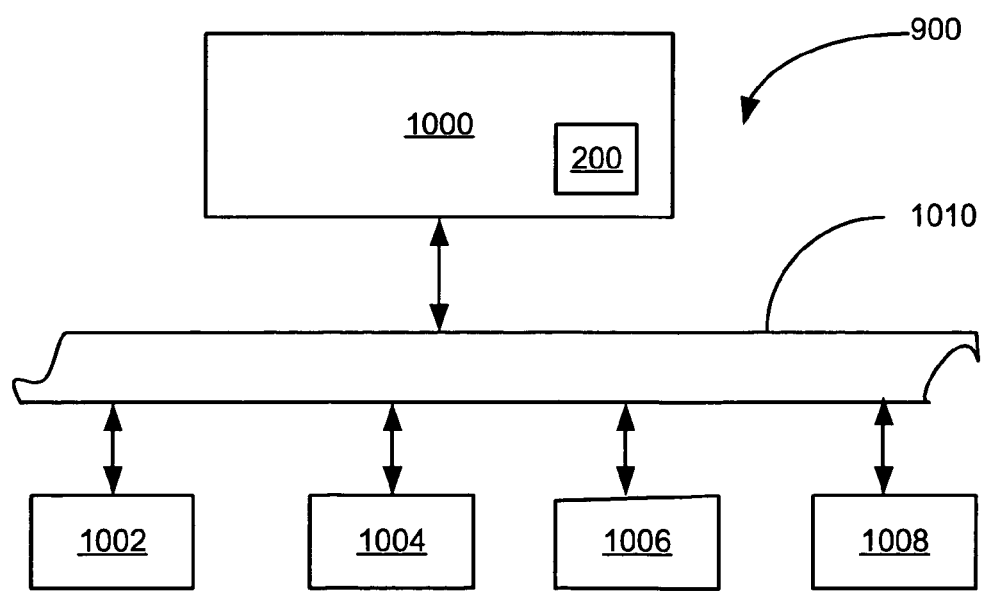
FIG. 8 is a schematic representation of a system incorporating the non-planar transistor of FIGS. 2a and 2b according to an embodiment.

Referring to FIG. 8, there is illustrated one of many possible systems 900 in which embodiments of the present invention may be used. An electronic assembly 1000 may include a non-planar microelectronic device 1001 which may be similar to the non-planar transistor 200 depicted above in FIGS. 2a and 2b. In one embodiment, the electronic assembly 1000 may further include a microprocessor. In an alternate embodiment, the electronic assembly 1000 may further include an application specific IC (ASIC). Integrated circuits found in chipsets (e.g., graphics, sound, and control chipsets) may also be packaged in accordance with embodiments of this invention.

For the embodiment depicted by FIG. 8, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 900 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A non-planar microelectronic device comprising:
    a substrate body including a substrate base and a fin, the fin defining a device portion at a top region thereof;
    a gate dielectric layer extending at a predetermined height on two laterally opposing sidewalls of the fin, the predetermined height corresponding to a height of the device portion;
    a device isolation layer on the substrate body and having a thickness up to a lower limit of the device portion;
    a gate electrode on the device isolation layer and further extending on the gate dielectric layer; and
    an isolation element extending on the two laterally opposing sidewalls of the fin up to a lower limit of the gate dielectric layer, the isolation element being adapted to reduce any fringe capacitance between the gate electrode and regions of the fin extending below the device portion;
    wherein:
        the device isolation layer defines side recesses on each side of the fin;
    and
        the gate electrode extends into the side recesses to define corresponding recess electrode portions.

2. The device of claim 1, wherein the gate dielectric further extends on a top surface of the device portion.

3. The device of claim 1, wherein the isolation element comprises an isolation layer.

4. The device of claim 1, wherein the substrate comprises a bulk monocrystalline silicon substrate.

5. The device of claim 1, wherein the isolation element comprises a material having etch characteristics that are different from etch characteristics of a material of the device isolation layer.

6. The device of claim 1, wherein the isolation element comprises one of a nitride and a low k dielectric material.

7. The device of claim 1, wherein the device isolation material comprises one of an oxide, a nitride and a sapphire material.

8. The device of claim 1 wherein the gate dielectric layer comprises one of silicon dioxide, tantalum pentaoxide, titanium oxide, PZT and BST.

9. The device of claim 1, wherein the gate electrode comprises one of a polycrystalline silicon, a polycrystalline silicon germanium alloy, tungsten, tantalum, a nitride of tungsten, and a nitride of tantalum.

10. A system comprising:
    a microelectronic assembly including:
        a non-planar microelectronic device comprising:
            a substrate body including a substrate base and a fin, the fin defining a device portion at a top region thereof;
            a gate dielectric layer extending at a predetermined height on two laterally opposing sidewalls of the fin, the predetermined height corresponding to a height of the device portion;

a device isolation layer on the substrate body and having a thickness up to a lower limit of the device portion;

a gate electrode on the device isolation layer and further extending on the gate dielectric layer;

an isolation element extending on the two laterally opposing sidewalls of the fin up to a lower limit of the gate dielectric layer, the isolation element being adapted to reduce any fringe capacitance between the gate electrode and regions of the fin extending below the device portion, wherein the device isolation layer defines side recesses on each side of the fin, and wherein the pate electrode extends into the side recesses to define corresponding recess electrode portions; and a main memory coupled to the microelectronic assembly.

11. The system of claim 10, wherein the isolation element comprises an isolation layer.

12. The device of claim 10, wherein the gate dielectric further extends on a top surface of the device portion.

* * * * *